United States Patent
Bindig et al.

(10) Patent No.: US 6,943,482 B2
(45) Date of Patent: Sep. 13, 2005

(54) MONOLITHIC MULTILAYER ACTUATOR IN A HOUSING

(75) Inventors: Reiner Bindig, Bindlach (DE); Hans-Jurgen Schreiner, Neunkirchen am Sand-Rollhofen (DE); Matthias Simmerl, Henfenfeld (DE); Jurgen Schmieder, Lauf (DE); Thilo Steichele, Nuremberg (DE)

(73) Assignee: Ceramtec AG Innovative Ceramic Engineering, Plochingen (DE)

( * ) Notice: Subject to any disclaimer, the term of this patent is extended or adjusted under 35 U.S.C. 154(b) by 0 days.

(21) Appl. No.: 10/481,363
(22) PCT Filed: Jun. 28, 2002
(86) PCT No.: PCT/EP02/07171
§ 371 (c)(1), (2), (4) Date: Jan. 22, 2004
(87) PCT Pub. No.: WO03/009400
PCT Pub. Date: Jan. 30, 2003

(65) Prior Publication Data
US 2004/0217672 A1 Nov. 4, 2004

(30) Foreign Application Priority Data
Jul. 12, 2001 (DE) .......... 101 34 035
Mar. 14, 2002 (DE) .......... 102 11 107

(51) Int. Cl.$^7$ ............ H01L 41/08
(52) U.S. Cl. .......... 310/328; 310/366; 310/344
(58) Field of Search .......... 310/328, 366, 310/344, 369

(56) References Cited

U.S. PATENT DOCUMENTS

| | | | | |
|---|---|---|---|---|
| 4,553,059 A | * | 11/1985 | Abe et al. ........... | 310/328 |
| 5,295,288 A | * | 3/1994 | Dam et al. .......... | 29/25.35 |
| 6,333,587 B1 | * | 12/2001 | Heinz et al. ........ | 310/328 |
| 6,552,472 B1 | * | 4/2003 | Heinz .............. | 310/328 |
| 6,677,034 B1 | * | 1/2004 | Hooley et al. ...... | 428/323 |

FOREIGN PATENT DOCUMENTS

| | | |
|---|---|---|
| DE | 38 33 109 A | 4/1990 |
| EP | 0 319 038 A | 6/1989 |
| JP | 04 349675 A | 12/1992 |
| JP | 07 094799 A | 4/1995 |
| WO | WO-99 30374 A | 6/1999 |

OTHER PUBLICATIONS

Patent Abstracts of Japan, vol. 017, No. 213—Apr. 26, 1993.
Patent Abstracts of Japan, vol. 1995, No. 07, Aug. 31, 1995.

* cited by examiner

Primary Examiner—Mark Budd
(74) Attorney, Agent, or Firm—Fulbright & Jaworski L.L.P.

(57) ABSTRACT

The invention relates to a monolithic multilayer actuator comprising a sintered stack of thin films, made from piezoceramic with inlaid metallic inner electrodes which extend from the stack on alternate sides and are electrically wired in parallel with external electrodes (3, 4) and are provided with connector wires (5). According to the invention, the actuator may be supplied with nominal voltage over a long period of time, without a change in the properties thereof, whereby the multilayer actuator (1) is sealed within a metallic or ceramic housing (8, 11, 16), the connector wires (5) are integral parts of the housing base (11) and the housing (8, 11, 16) is filled with a water-absorbing medium (14) and a water-transporting, electrically-insulating medium (15).

22 Claims, 3 Drawing Sheets

Figure 1:
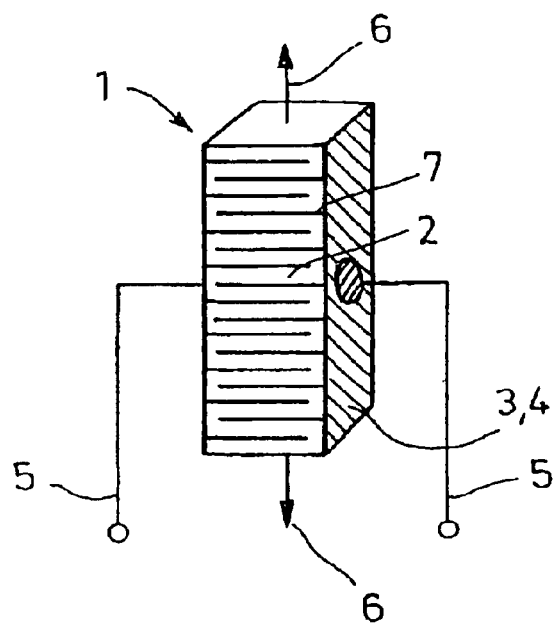

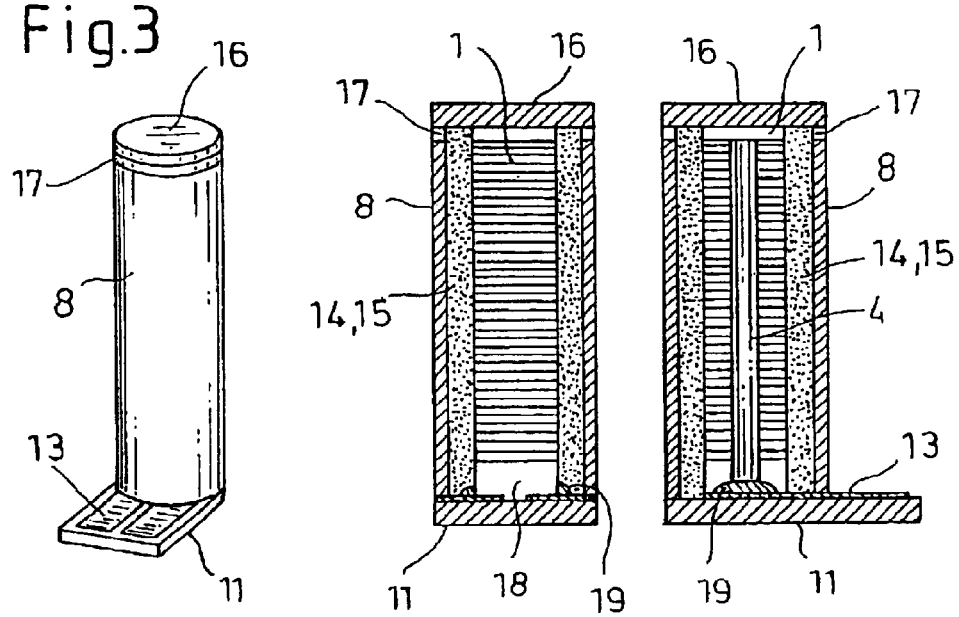
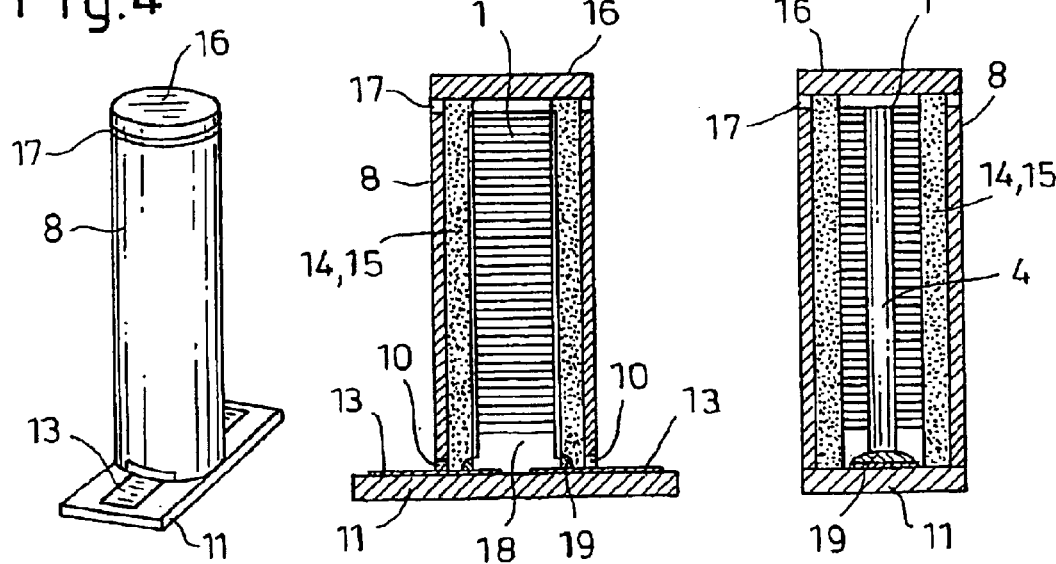

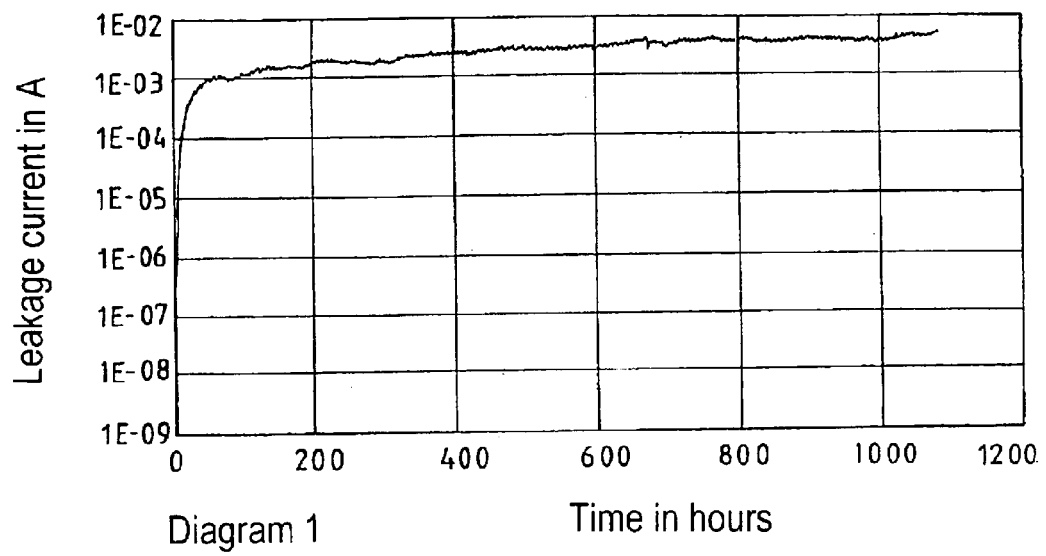
Diagram 1
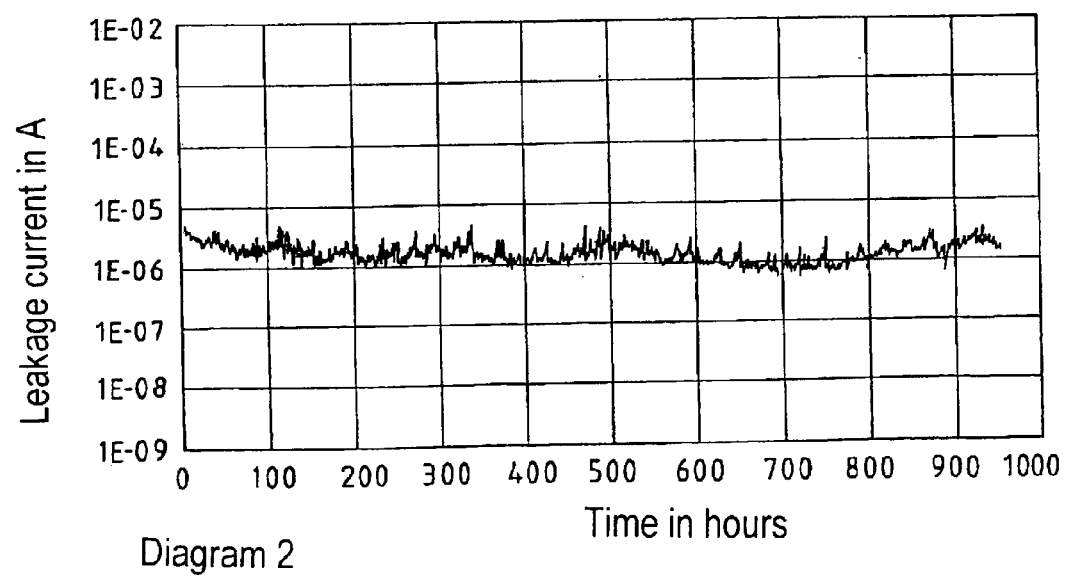
Diagram 2

MONOLITHIC MULTILAYER ACTUATOR IN A HOUSING

This application claims priority from PCT/EP02/07171 filed Jun. 28, 2002, which claims priority from German 101 34 035.4 filed Jul. 12, 2001 and German 102 11 107.3 filed Mar. 14, 2002.

The present invention relates to a monolithic multilayer actuator according to the precharacterising part of claim 1.

Piezoceramic multilayer actuators (MPA, see FIG. 1) consist of stacked thin layers of piezoelectrically active material 2, e.g. lead zirconate/titanate (PZT) with electrically conducting internal electrodes 7 arranged therebetween, which are guided in an alternating manner on the actuator surface. External electrodes 3, 4 connect these internal electrodes. In this way the internal electrodes are connected electrically in parallel and assembled to form two groups that constitute the two connecting terminals of the actuator. If an electrical voltage is applied to the connecting terminals this is transmitted in parallel to all internal electrodes and produces an electrical field in all layers of the active material, which is thereby mechanically deformed. The accumulation of all these mechanical deformations is available at the end surfaces of the actuator as a utilisable expansion 6 and/or force. The connecting terminals are controlled by means of electrical connecting wires 5.

Piezoceramic multilayer actuators according to the prior art are designed as monoliths, i.e. before the sintering process the active material as a so-called green film is provided with internal electrodes by means of a screen-printing process using a precious metal paste, compressed into actuator stacks, pyrolysed and then sintered, whereby the monolithic actuator is formed.

The surfaces of the actuator body are now worked by means of a shaping process, in general by grinding. A metal base 33 is applied to the actuator 1 in the region of the projecting internal electrodes 7, for example by galvanic methods or screen printing using metal paste. This metal base is strengthened by applying a metallic material 34, for example by soldering on a structured metal sheet or a wire net. The electrical connecting wire 5 is soldered onto this reinforced layer. Before or after the connecting wires are soldered on, the actuator is coated with an electrically insulating coating that in addition protects the actuator surfaces against mechanical damage.

Figure 2:
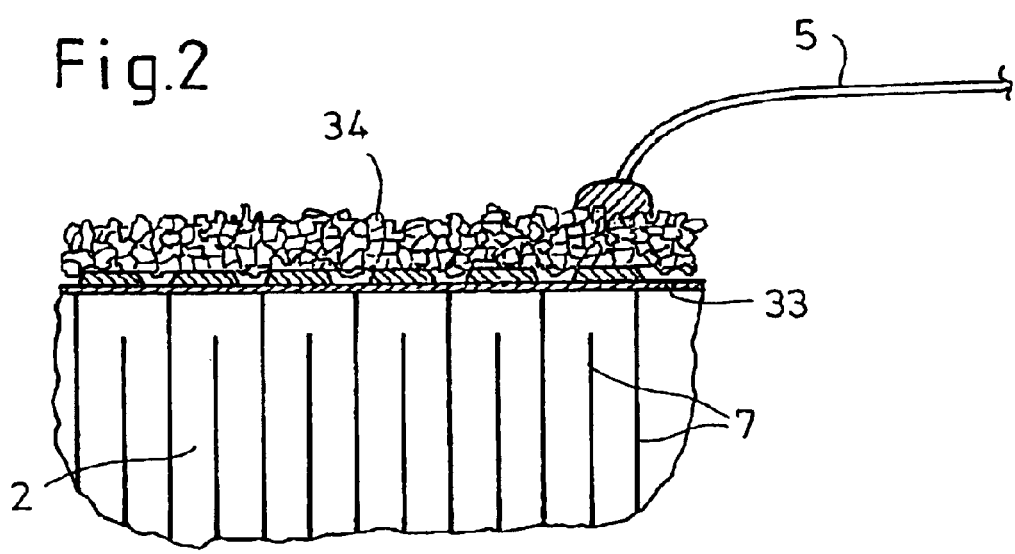

FIG. 1 is a general view of an MPA, while FIG. 2 shows further details.

The structure and the production of such actuators and external electrodes are described in detail for example in DE 33 30 538 A1, DE 40 36 287 C2, U.S. Pat. No. 5,281,885, U.S. Pat. No. 4,845,399, U.S. Pat. No. 5,406,164 and JP 07-226541 A.

Many applications of actuators require that the structural part can be subjected to the rated voltage for long periods of time without experiencing any changes in its properties. Typical applications are adjustment and positioning drive devices that set a specific position and, depending on the circumstances, have to maintain the latter over months and even years. This requirement cannot be met by actuators according to the prior art described above.

The reason for this is that, due to the high electrical field strength at the actuator surface, polar molecules, usually water vapour, are attracted from the environment. This water vapour more or less rapidly penetrates all known polymeric coatings and ultimately leads to increased conductivity and to rising leakage current at the actuator surface. The leakage current rises until, due to the likewise increasing actuator temperature, an equilibrium for water vapour adsorption due to the electrical field and desorption due to the actuator temperature is established. Diagram 1 shows the typical leakage current behaviour over time for an actuator of dimensions 7×7×30 mm$^3$ at an internal field strength of 2000 V/mm under normal laboratory environment conditions at 200 V, 25° C. and 40% relative humidity.

If ceramic coatings or glasses are used as coating, the water vapour penetrates through microcracks in the coating that are inevitably formed due to the operation of the actuator.

Also, sealing with a suitable encapsulating compound in a metal housing is not successful since already the extremely small amounts of water that are contained in the encapsulating compound or that penetrate during the encapsulation step are sufficient to trigger the effect.

The connecting wires that have to be led outwardly through the coating or the housing constitute a further weak point Wires insulated by polymers do not meet this objective, for the reasons mentioned above Metal/glass lead-throughs are problematic since they are destroyed by the movement of the actuator The object of the invention is to improve a multilayer actuator according to the precharacterising part of claim 1 so that the actuators can be subjected to the rated voltage over long periods of time without experiencing changes in their properties According to the invention this object is achieved if the multilayer actuator is hermetically enclosed in a metallic or ceramic housing, the connecting wires are integral constituents of the housing floor, and the housing is filled with a water-absorbing medium and a water-transporting, electrically insulating medium.

Such encapsulated actuators have constantly low leakage currents, even when they are permanently operated at the rated field strength. Diagram 2 shows the leakage current behaviour of such an encapsulated actuator. Actuator dimensions and other parameters correspond to the measurement of diagram 1. The leakage current of the encapsulated structural part is about 1000 times less than that of the non-encapsulated actuator. A ceramic housing, silicate desiccator and a perfluoropolyether packing were used.

Water diffusing in through the possibly existing elastic cover joint, or water already present in the housing, is thereby trapped and rendered harmless.

In a preferred embodiment the housing consists of a housing jacket, in particular a tubular housing jacket, with a housing cover and a housing floor, the housing cover being mounted with a permanently elastic sealing medium on the housing jacket.

The housing floor advantageously consists of a ceramic material.

The connecting wires are preferably mounted in the form of conducting tracks on the housing floor.

Preferably the conducting tracks are produced by the thick-film method (forcing in metal paste and stoving the latter into the housing floor).

A connector is soldered onto the connecting wires or the conducting tracks advantageously outside the housing jacket.

Advantageously the water-transporting, electrically insulating medium is-a gas or a liquid and is chosen in particular from silicone oils or perfluorinated carbon compounds. Preferably the water-transporting, electrically insulating medium is perfluorinated polyether or dry air.

The water-absorbing medium is preferably a silicate compound, anhydrous calcium oxide or a hygroscopic substance such as calcium chloride or lithium chloride, and consists in particular of dry gel or a molecular sieve.

The production of the multilayer actuator according to the invention is described in more detail hereinafter.

A low-sintering piezoceranic material, e.g. SKN53 according to DE 198 40 488 A1, is prepared with an organic binder system to form a 125 μm thick film. A commercially obtainable internal electrode paste is applied by means of screen printing to this film. A plurality of such films is stacked and compressed into a laminate, some films without internal electrodes remaining on the upper side and/or lower side of the laminate in order to produce an inactive region on which the actuator can subsequently be electrically contacted. The laminate is split into individual, rod-shaped actuators, which are sintered at 900° C.–1100° C., preferably at 1000° C. After the actuator surfaces have been ground, the metal base 33 of silver is applied by means of a screen-printing/stoving process to the contact sides. The external electrodes consisting of a metal wire network are soldered onto the latter. In order to provide protection against mechanical damage and for electrical insulation in the subsequent measuring procedures, the actuators are now insulated with a commercially obtainable silicone lacquer. Of all known types of lacquer, silicone has the highest permeability to water vapour. The actuators can now be polarised and electrically measured.

An actuator housing is produced by cutting a metal tube or ceramic tube as housing jacket 3 to size so that it is about 0.5 mm shorter than the actuator 1. The internal diameter of the tube section is such that the actuator 1 does not touch the tube wall when it is inserted into the tube. If a metal tube is used, it must have two recesses 10 at those points at which the conducting tracks 13 of the floor part 11 pass through underneath the tube 8.

A floor part 11 for the housing is produced by pressing and stoving two conducting tracks 13, for example of a silver/palladium alloy, onto a plane-parallel but otherwise arbitrarily shaped small ceramic plate using a thick-film paste by means of screen printing, which conducting tracks form the contact for the actuator 1 and project out from underneath the ceramic or metal tube 8.

The actuator 1 is now bonded, for example with an epoxy adhesive, to the floor part so that it can be contacted by the two conducting tracks 13. The contact is formed by means of soldering, welding or bonding with electrically conducting adhesive. L-shaped contact strips of metal facilitate this procedure.

The actuator housing and the housing jacket 8 is placed over the actuator 1 and is bonded to the floor part 11, for example with an epoxy adhesive. The actuator 1 now stands ca. 0.5 mm above the housing. During this procedure the actuator must not touch the housing.

The space between the actuator and actuator housing is now filled with a water-absorbing, pulverulent medium 14, for example powdered dry gel. In order to make the powder free-flowing it is screened to a certain grain size, for example 0.1 mm. The dry powder is dehydrated at elevated temperature before it is packed into the said space. This procedure is governed however by the type of desiccant that is used. In principle all water-attracting substances may be used, for example calcium oxide, calcium chloride, lithium chloride and the like. However, the latter form a liquid phase if they have absorbed too much water, which can lead to arcing on the surface of the actuator. Desiccants based on silicates, such as for example silica gel and perovskite molecular sieves, bind the water in the crystal lattice. When the desiccant is exhausted the leakage current slowly rises, but does not cause a failure of the structural part.

The powder bed is now impregnated with a liquid but water-conducting insulating medium 15. This insulating medium must be made anhydrous, for example by heating, before it is packed in the space. In particular silicone oils and perfluorinated carbon compounds are suitable for this purpose. Silicone encapsulating compounds and mineral oils act more slowly (in terms of water transportation), but in principle are just as good if used in a careful, anhydrous procedure.

The housing cover, which consists of a small plane-parallel ceramic plate, is bonded to the actuator with for example an epoxy adhesive.

The remaining gap 17 between the housing cover 16 and actuator housing 8 is filled with a permanently elastic sealing medium, for example a silicone sealant.

The procedure described above for the production of monolithic multilayer actuators has, as mentioned in the introduction, been described in detail in the patent literature and other publications. The procedure according to the invention for the encapsulation of the actuators need not correspond to the described operating procedure. Similar procedures that lead to the same result can also be derived by experienced persons skilled in the art.

EXAMPLE OF IMPLEMENTATION 1

This example of implementation is illustrated in FIG. 3.

A 125 μm thick green film of SKN53 is produced by formulating the ceramic powder, ground to a mean grain size of ca. 1 μm, with solvents, organic binders, plasticisers and dispersing aids to form a casting slurry, from which an endless film is cast by means of the doctor blade method and is then dried.

An internal metallising paste that contains as metal powder silver/palladium in a mixture ratio of 70/30 is pressed in the form of the desired internal electrode design by means of screen printing onto the green film, the thickness of the printed layer after drying being 8 μm.

360 printed films and 60 unprinted films are stacked on top of one another and compressed at an elevated temperature into a block. The block is cut up by means of a hard-metal cutting tool into individual, rod-shaped actuators.

The actuators are pyrolysed at 400° C. and then sintered for 10 hours at 1000° C. Following this the thickness of the internal electrodes is ca. 3 μm. After the sintering the external dimensions of the actuators are 7.1×7.1×30.5 mm$^3$.

The actuators are now ground to size on all sides using diamond grinding discs. After this procedure the external dimensions are 7×7×30 mm$^3$.

External electrodes of silver/palladium (80/20) are applied to the contact surfaces by means of screen printing and stoved at 800° C.

A net-like wire mesh (EP 0 844 678 A1) is soldered on for purposes of reinforcement.

The actuators are now protected by applying a, commercially obtainable silicone coating lacquer.

Polarisation is then performed by applying a voltage of 200V to the structural parts at a temperature of ca. 120° C.

A tube 8 of alununium oxide ceramic with an internal diameter of 10 mm, an external diameter of 12 mm and a length of 29.5 mm is produced.

A small aluminium oxide ceramic plate 11 (housing floor) 1 mm thick, 15 mm long and 12 mm wide is produced. The plate is ground to the desired thickness in a plane-parallel manner. Two conducting tracks 13 of silver/palladium (80/

20) are applied lengthwise next to one another by means of screen printing and stoved at 800° C. The conducting tracks 13 are 14 mm long, 5 mm wide and have an interspacing of 1 mm.

A small altminium oxide ceramic plate 16 (housing cover) of 12 mm diameter and 1 mm thick is produced. The cover is ground to the desired thickness in a plane-parallel manner.

Dry powder 14 is produced by comminuting desiccant (blue gel) in a plate-type crushing mill, and is screened to a grain size of 50 µm to 100 µm. The powder is dried to an anhydrous state in a drying cabinet at 120° C. for ca. 10 hours.

Silicone oil as insulating medium 15 is dried to an anhydrous state at 120° C. for ca. 10 hours.

An actuator 1 is bonded together with the inactive foot 18 by means of epoxide adhesive to a floor part so that, with regard to the overall housing diameter, the floor part projects on one side.

The external electrodes 4 are soldered to the conducting tracks 13 using copper foil strips.

The ceramic tube 8 is slid over the actuator and bonded to the floor part 11 by means of epoxide adhesive. The floor part projects on one side.

The housing together with the actuator is now heated at 120° C. for 10 hours. The space between the actuator and housing wall is filled with dry powder 14. The dry powder is impregnated with silicone oil 15. The cover part 16 is bonded in the middle to the actuator by means of epoxide adhesive. During these steps the temperature of the housing should never fall below 100° C.

After cooling, the remaining gap 17 between the housing cover and housing is filled with silicone sealant.

A connector (printed circuit board connector) is soldered to the projecting conducting tracks 13 of the floor part.

Actuators encapsulated in this way have the following property when activated with a direct voltage of 200V: after the charging current has died away, there is a leakage current of about 1 to 2 µA. This leakage current is unchanged even after 3000 hours.

EXAMPLE OF IMPLEMENTATION 2

The example of implementation is illustrated in FIG. 4.

Piezoelectric monolithic multilayer actuators are produced as in the example of implementation 1.

A tube of aluminium 8 with an internal diameter of 10 mm, an external diameter of 10.5 mm and a length of 29.5 mm is produced. The tube includes two recesses 10 that are 0.5 mm high and 5 mm wide.

A small aluminium oxide ceramic plate 11 (housing floor) 1 mm thick, 16.5 mm long and 10.5 mm wide is produced. The plate is ground to the desired thickness in a plane-parallel manner. Two conducting tracks 13 of silver/ palladium (80/20) are applied lengthwise one behind the other to the plate by means of screen printing and stoved at 800° C. The conducting tracks are 7.5 mm long and 4 mm wide and have an interspacing of 1 mm.

A small aluminium oxide ceramic plate 16 (housing cover) 12 mm in diameter and 1 mm thick is produced. The plate is ground to the desired thickness in a plane-parallel manner.

Ground anhydrous calcium oxide is used as dry powder 14.

Perfluorinated polyether is used as insulating medium 15, whose chain length is adjusted so that the polyether has a boiling point of 240° C. The medium is heated for several minutes at the boiling point in order to make it anhydrous.

An actuator together with the inactive foot 18 is bonded in the middle to a floor part by means of epoxide adhesive, so that the external electrodes 4 can be bonded-to the conducting tracks of the floor part.

The external electrodes 4 are soldered to the conducting tracks 13 using copper foil strips.

The aluminium tube 8 is slid over the actuator 1 so that the recesses are flush with the conducting tracks 13, and is bonded to the floor part 11 by means of epoxide adhesive. The floor part projects on both sides. The recesses 10 are filled with the adhesive and are thus sealed.

The housing together with the actuator is now heated at 120° C. for 10 hours. The space between the actuator and housing wall is filled with the dry powder 14. The dry powder 14 is impregnated with the insulating medium 15. The cover part 16 is bonded in the middle to the actuator by means of epoxide adhesive. During these steps the temperature of the housing should never fall below 100° C.

After cooling, the remaining gap 17 between the housing cover and housing is filled with silicone sealant.

Two connectors (printed circuit board connectors) are soldered onto the projecting conducting tracks 13 of the floor part.

Actuators encapsulated in this way have the following property when activated with a direct voltage of 200V: after the charging current has died away, there is a leakage current of about 2 to 3 µA. This leakage current is unchanged even after 3000 hours. Encapsulations of this type tend to be somewhat more unfavourable since, due to the short insulating section comprising conducting-strip/housing/ conducting strip, a considerable leakage current flows, which increases the overall leakage current that is measured.

DRAWINGS

FIG. 1: Structure of a monolithic multilayer actuator

FIG. 2: Detailed view of FIG. 1

FIG. 3: Actuator encapsulated according to the invention in a ceramic housing, external view, two sections FIG. 4: Actuator encapsulated according to the invention in a ceramic housing,. external view, two sections Diagram 1: Leakage current behaviour of a standard actuator without encapsulation.

Diagram 2: Leakage current behaviour of an actuator encapsulated according to the invention.

What is claimed is:

1. A monolithic multilayer actuator comprising a sintered stack of thin films of a piezoceramic material having inlaid metallic internal electrodes that project in an alternating manner from the stack end are electrically connected in parallel by external electrodes and are provided with connecting wires, wherein the multilayer actuator is hermetically enclosed by a metallic or ceramic housing the connecting wires are integral constituents of the housing floor and the housing is filled with a water-absorbing medium and a water-transporting, electrically insulating medium, wherein said connecting wires are applied in the form of conducting tracks to the housing floor.

2. The multilayer actuator according to claim 1, wherein the housing comprises a housing jacket with a housing cover and a housing floor and wherein the housing cover together with a permanently elastic sealing medium is mounted on the housing jacket.

3. The multilayer actuator according to claim 2, wherein the housing floor comprises a ceramic material.

4. The multilayer actuator according to claim 2, wherein said connector is soldered onto the connecting wires or conducting tracks outside the housing jacket.

5. The multilayer actuator according to claim 1 wherein said conducting tracks are produced by the thick-film method.

6. The multilayer actuator according to claim 1, wherein a connector is soldered onto the connecting wires or conducting tracks outside the housing jacket.

7. The multilayer actuator according to claim 1, wherein said water-transporting, electrically insulating medium is a gas or a liquid and is derived from the classes comprising silicone oils or perfluorinated carbon compounds.

8. The multilayer actuator according to claim 7, wherein said water-transporting, electrically insulating medium is perfluorinated polyether or dry air.

9. The multilayer actuator according to claim 1, wherein said water-absorbing medium is selected from the group consisting of a silicate compound, anhydrous calcium oxide and a hygroscopic substance.

10. The multilayer actuator according to claim 9, wherein said water-absorbing medium is a dry gel.

11. The multilayer actuator according to claim 9, wherein said water-absorbing medium is a molecular sieve.

12. The multilayer actuator according to claim 9, wherein said water-absorbing medium is calcium chloride or lithium chloride.

13. A monolithic multilayer actuator comprising:

a sintered stack of thin sheets of piezoceramic having embedded metal internal electrodes which lead alternately out of the stack and which are connected electrically parallel through external electrodes and provided with connecting wires;

the multilayer actor being sealingly enveloped by a case comprising at least one of a metal or a ceramic and having a case periphery, a case cover and a case bottom, wherein the case is filled with a moisture absorbing medium and wherein the case bottom is ceramic; and wherein the case cover with a permanently elastic sealing medium is placed onto the case periphery; and said connecting wires are integral components of the case bottom and are applied to the case bottom in the form of conductor strips; and wherein said moisture-absorbing medium is in powder form and is a silicate compound, anhydrous calcium oxide or a hygroscopic substance; and wherein the case is filled with a water transporting, electrically insulating medium that is a liquid and originates from the classes of the silicone oils or the perfluorinated carbon compounds; wherein the moisture absorbing medium is imbibed with the water transporting, electrically insulating medium.

14. The multilayer actuator according to claim 13, wherein the conducting strips are made by a thick coating method.

15. The multilayer actuator according to claim 13, wherein a plug connector is soldered to the connecting wires and conductor strips outside of the case periphery.

16. The multilayer actuator according to claim 14, wherein a plug connector is soldered to the connecting wires and conductor strips outside of the case periphery.

17. The multilayer actuator of claim 13, wherein said moisture absorbing medium is calcium chloride or lithium chloride.

18. The multilayer actuator according to claim 13, wherein said water-absorbing medium is a molecular sieve.

19. The multilayer actuator according to claim 13, wherein said water-absorbing medium is a dry gel.

20. The multilayer actuator according to claim 13, wherein said water-transporting, electrically insulating medium is a gas or a liquid and is derived from the classes comprising silicone oils or perfluorinated carbon compounds.

21. The multilayer actuator of claim 13, wherein the water-transporting, electrically insulating medium is perfluorinated polyester.

22. The multilayer actuator of claim 8, wherein the water-transporting, electrically insulating medium is perfluorinated polyester.

* * * * *